United States Patent
Kim et al.

(10) Patent No.: US 11,309,280 B2
(45) Date of Patent: Apr. 19, 2022

(54) SEMICONDUCTOR DEVICE PACKAGE

(71) Applicant: SAMSUNG ELECTRONICS CO., LTD., Suwon-si (KR)

(72) Inventors: Yong-hoon Kim, Suwon-si (KR); Kil-soo Kim, Hwaseong-si (KR); Kyung-suk Oh, Seongnam-si (KR); Tae-joo Hwang, Yongin-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 16/923,418

(22) Filed: Jul. 8, 2020

(65) Prior Publication Data

US 2020/0343219 A1    Oct. 29, 2020

Related U.S. Application Data

(63) Continuation of application No. 16/002,018, filed on Jun. 7, 2018, now Pat. No. 10,727,199.

(30) Foreign Application Priority Data

Nov. 16, 2017   (KR) .................. 10-2017-0153312

(51) Int. Cl.
   *H01L 25/065*   (2006.01)
   *H01L 23/552*   (2006.01)
   (Continued)

(52) U.S. Cl.
   CPC ........ *H01L 25/0652* (2013.01); *H01L 23/367* (2013.01); *H01L 23/3675* (2013.01);
   (Continued)

(58) Field of Classification Search
   CPC ....... H01L 25/0652; H01L 2225/06589; H01L 23/367; H01L 23/3675; H01L 23/552;
   (Continued)

(56) References Cited

U.S. PATENT DOCUMENTS 7,031,162 B2 *   4/2006   Arvelo .................. H01L 23/433
                                                                 361/718
7,964,951 B2     6/2011   Refai-Ahmed
                          (Continued)

FOREIGN PATENT DOCUMENTS

KR   10-2007-0006583       1/2007
KR   10-2011-0008824 A     1/2011
                      (Continued)

OTHER PUBLICATIONS

Korean Office action dated Dec. 30, 2021.

*Primary Examiner* — Shahed Ahmed
*Assistant Examiner* — Khatib A Rahman
(74) *Attorney, Agent, or Firm* — Lee IP Law, PC (57) ABSTRACT

An electronic device includes a circuit board, a semiconductor device package mounted on the circuit board, the semiconductor device package including a package substrate connected to the circuit board, a first semiconductor device and a second semiconductor device mounted side by side on the package substrate, and a molding surrounding a sidewall of the first semiconductor device and a sidewall of the second semiconductor device, the molding not covering a top surface of the first semiconductor device, and a heat dissipation structure on the semiconductor device package, the top surface of the first semiconductor device being in contact with the heat dissipation structure.

15 Claims, 8 Drawing Sheets

(51) Int. Cl.
*H01L 23/367* (2006.01)
*H04M 1/02* (2006.01)
*H01L 23/427* (2006.01)

(52) U.S. Cl.
CPC ........ *H01L 23/552* (2013.01); *H04M 1/0277* (2013.01); *H01L 23/427* (2013.01); *H01L 2225/06537* (2013.01); *H01L 2225/06541* (2013.01); *H01L 2225/06555* (2013.01); *H01L 2225/06582* (2013.01); *H01L 2225/06589* (2013.01)

(58) Field of Classification Search
CPC ......... H01L 23/427; H01L 2225/06537; H01L 2225/06541; H01L 2225/06555; H01L 2225/06582; H01L 23/373; H04M 1/0277
See application file for complete search history.

(56) References Cited

U.S. PATENT DOCUMENTS

| | | | |
|---|---|---|---|
| 8,558,372 B2* | 10/2013 | Negoro | H01L 23/36 257/707 |
| 9,136,202 B2 | 9/2015 | Chiriac et al. | |
| 9,508,675 B2 | 11/2016 | Lu et al. | |
| 10,727,199 B2* | 7/2020 | Kim | H01L 25/0652 |
| 2008/0150088 A1* | 6/2008 | Reed | H01L 25/0652 257/621 |
| 2009/0224400 A1* | 9/2009 | Rahman | H01L 25/0652 257/713 |
| 2011/0018119 A1 | 1/2011 | Kim et al. | |
| 2012/0018871 A1* | 1/2012 | Lee | H01L 23/4334 257/698 |
| 2012/0106117 A1* | 5/2012 | Sundaram | H01L 25/18 361/808 |
| 2012/0139097 A1* | 6/2012 | Jin | H01L 23/3142 257/712 |
| 2013/0043581 A1* | 2/2013 | Negoro | H01L 23/13 257/712 |
| 2013/0208426 A1 | 8/2013 | Kim et al. | |
| 2014/0048924 A1* | 2/2014 | Lee | H01L 23/3672 257/713 |
| 2015/0084190 A1 | 3/2015 | Hung et al. | |
| 2015/0340303 A1 | 11/2015 | Oh et al. | |
| 2016/0093598 A1* | 3/2016 | Jo | H01L 23/481 257/713 |
| 2017/0062383 A1* | 3/2017 | Yee | H01L 24/17 |
| 2017/0084576 A1 | 3/2017 | Yu et al. | |
| 2017/0345763 A1 | 11/2017 | Cheah et al. | |
| 2018/0294249 A1* | 10/2018 | Watanabe | H01L 24/19 |

FOREIGN PATENT DOCUMENTS

| | | |
|---|---|---|
| KR | 10-2013-0020570 A | 2/2013 |
| KR | 10-2013-0094107 | 8/2013 |
| KR | 10-2014-0147138 A | 12/2014 |
| KR | 10-1550847 B1 | 9/2015 |
| KR | 10-2015-0135611 A | 12/2015 |
| KR | 10-2016-0037582 | 4/2016 |
| KR | 10-2016-0047423 A | 5/2016 |
| KR | 10-1678539 B1 | 11/2016 |

\* cited by examiner

SEMICONDUCTOR DEVICE PACKAGE

CROSS-REFERENCE TO RELATED APPLICATION

This is a continuation application based on pending application Ser. No. 16/002,018, filed Jun. 7, 2018, the entire contents of which is hereby incorporated by reference.

Korean Patent Application No. 10-2017-0153312, filed on Nov. 16, 2017, in the Korean Intellectual Property Office, and entitled: "Electronic Device Including Semiconductor Device Package," is incorporated by reference herein in its entirety.

BACKGROUND

1. Field

Embodiments relate to an electronic device including a semiconductor device package.

2. Description of the Related Art

With the requisition for miniaturization and high performance of electronic devices, the thinning and high performance of semiconductor device packages included in the electronic devices are also required.

SUMMARY

Embodiments are directed to an electronic device, including a circuit board, a semiconductor device package mounted on the circuit board, the semiconductor device package including a package substrate connected to the circuit board, a first semiconductor device and a second semiconductor device mounted side by side on the package substrate, and a molding surrounding a sidewall of the first semiconductor device and a sidewall of the second semiconductor device, the molding not covering a top surface of the first semiconductor device, and a heat dissipation structure on the semiconductor device package, the top surface of the first semiconductor device being in contact with the heat dissipation structure.

Embodiments are also directed to an electronic device including a circuit board, a semiconductor device package mounted on the circuit board, a TIM layer in contact with an upper portion of the semiconductor device package, and a heat dissipation structure in contact with the TIM layer. The semiconductor device package includes a package substrate connected to the circuit board, a first semiconductor device mounted on the package substrate, the first semiconductor device being in contact with the TIM layer, a second semiconductor device mounted on the package substrate, the second semiconductor device spaced apart from the first semiconductor device in a lateral direction parallel to the circuit board, and a molding covering a sidewall of the first semiconductor device and a sidewall of the second semiconductor device.

Embodiments are also directed to an electronic device, including a circuit board having a first region and a second region that are apart from each other, a semiconductor device package mounted on the first region of the circuit board, the semiconductor device package including a package substrate, a first semiconductor device and a second semiconductor device mounted side by side on the package substrate, and a molding surrounding a sidewall of the first semiconductor device and a sidewall of the second semiconductor device, the molding not covering a top surface of the first semiconductor device, a heat dissipation structure on the semiconductor device package, the heat dissipation structure extending over the second region of the circuit board, and a thermal interface material (TIM) layer between the semiconductor device package and the heat dissipation structure, the top surface of the first semiconductor device being in contact with the TIM layer.

BRIEF DESCRIPTION OF THE DRAWINGS

Features will become apparent to those of skill in the art by describing in detail example embodiments with reference to the attached drawings in which.

DETAILED DESCRIPTION

Herein, an electronic device may refer to an arbitrary device including a semiconductor device package. The electronic device may include, e.g., one or more of a smartphone, a tablet personal computer (PC), a mobile phone, a video phone, an electronic-book (e-book) reader, a desktop PC, a laptop PC, a netbook computer, a workstation, a server, a personal digital assistant (PDA), a portable multimedia player (PMP), an MPEG-1 audio layer 3 (MP3) player, a mobile medical device, a camera, a home appliance, a medical device, an Internet of Things (IoT) device, and a wearable device. The wearable device may be an accessory type, a fabric or clothing type, a body attachment type, or an implantable circuit type. An accessory-type wearable device may be, e.g., a watch, a ring, a bracelet, an ankle bracelet, a necklace, glasses, contact lenses, or a head-mounted device (HMD).

Hereinafter, examples of an electronic device according to various embodiments will be described with reference to the accompanying drawings.

Figure 1:
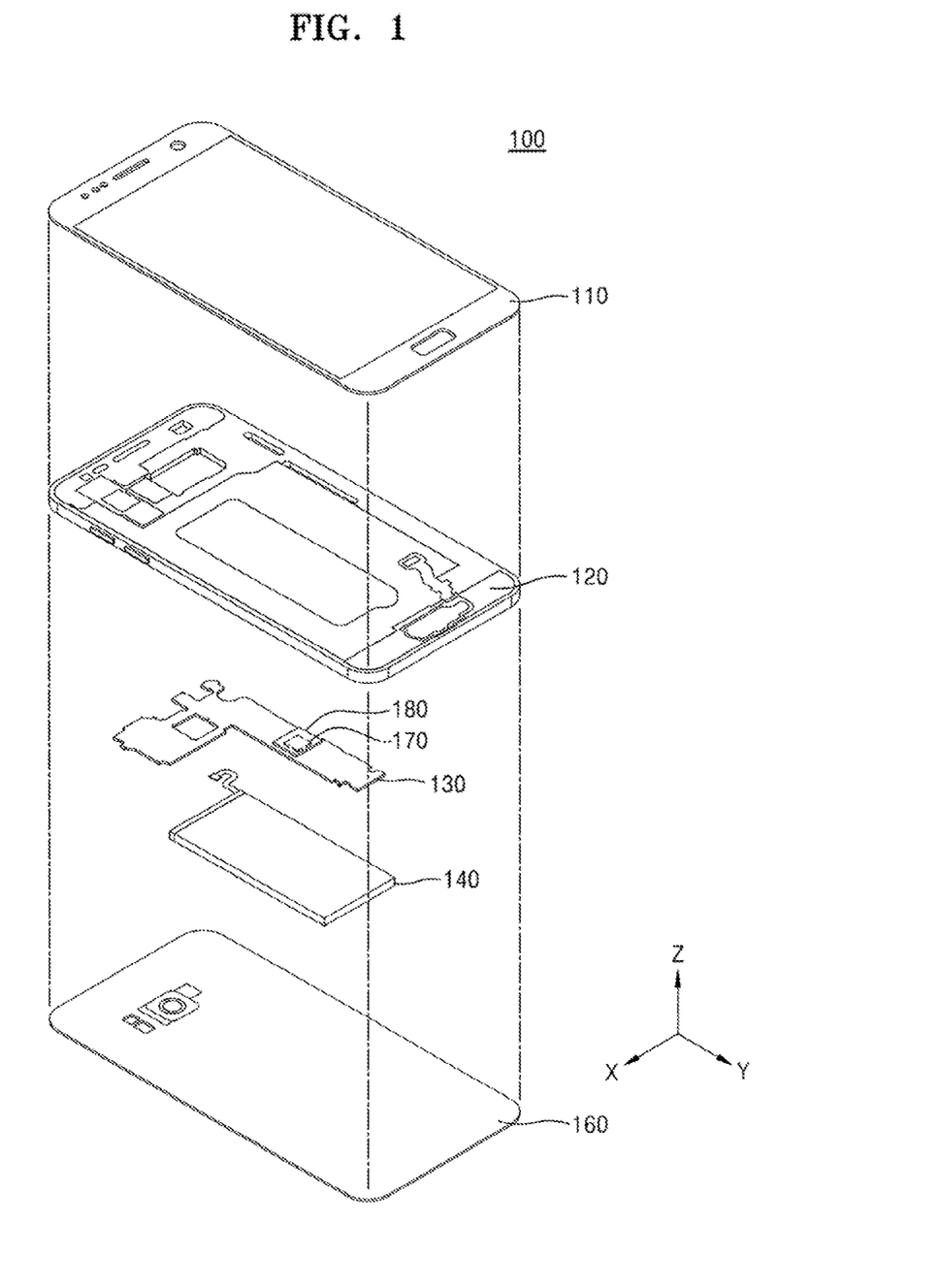
FIG. 1 illustrates an exploded perspective view of an electronic device according to an example embodiment.

FIG. 1 is an exploded perspective view of an electronic device 100 according to an example embodiment.

Referring to FIG. 1, the electronic device 100 according to the embodiment may be, e.g., a smartphone. The electronic device 100 may include a front cover 110, a bracket 120, a circuit board 130, a battery 140, and a rear cover 160.

The front cover 110 may function as both an output terminal via which a screen outputs information and an input terminal via which information or a command may be input by using a touch screen. The front cover 110 may include, e.g., a window portion and a display device mounted inside the window portion. A touch panel may be mounted between the window portion and the display device.

The bracket 120 may include or be coupled to various electronic components. For example, a circuit board 130, on which various components are mounted, and a battery 140 may be coupled to the bracket 120. To efficiently dissipate heat generated by the electronic components, at least a portion of the bracket 120 may include a thermal conductive material, such as a metal.

The circuit board 130 may be, e.g., a printed circuit board (PCB) or a flexible printed circuit board (FPCB). At least one semiconductor device package 170 may be mounted on the circuit board 130.

To efficiently dissipate heat generated by the semiconductor device package 170, the semiconductor device package 170 may be connected to a heat dissipation structure 180. The heat dissipation structure 180 may be a suitable structure (or structures) having a heat transfer function. For example, the heat dissipation structure 180 may include one or more of a heat-dissipation plate, a heat-dissipation sheet, and a shield scan. The heat dissipation structure 180 may prevent heat generated by the semiconductor device package 170 from damaging the semiconductor device package 170 and surrounding components.

The rear cover 160 may protect the circuit board 130 and other components from physical impact. The rear cover 160 may form an appearance of the electronic device 100 together with the front cover 110 and the bracket 120.

Figure 2:
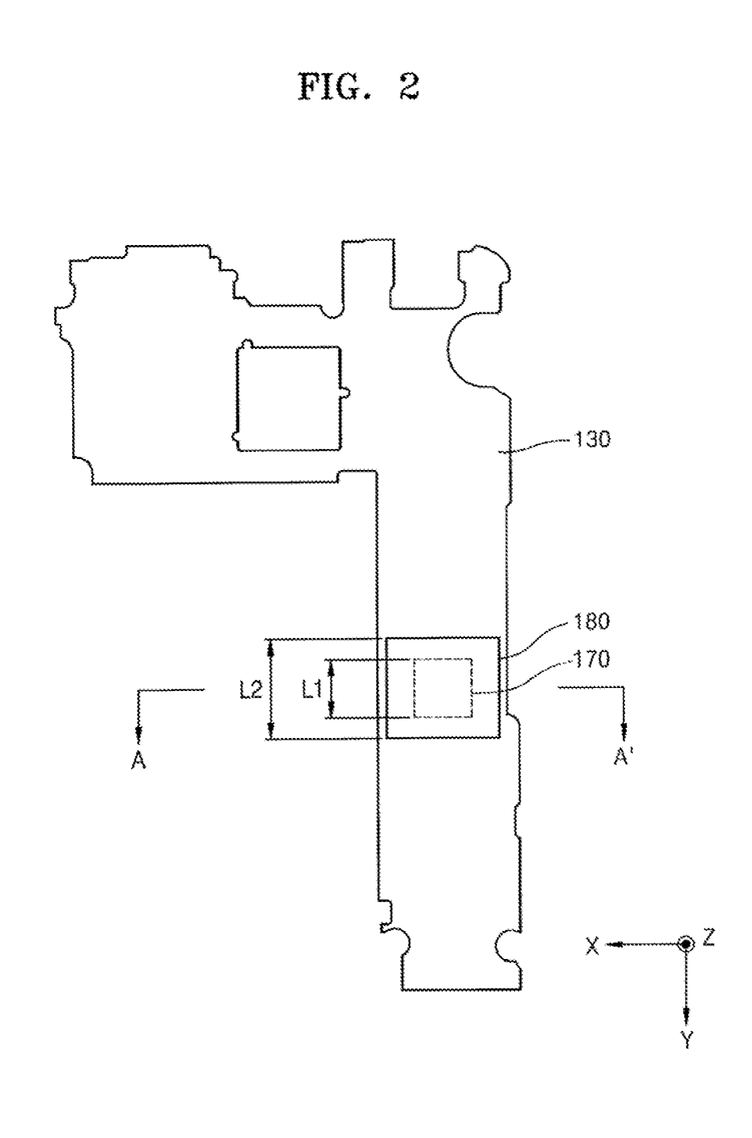
FIG. 2 illustrates a plan view of a circuit board, a semiconductor device package, and a heat dissipation structure, which are included in an electronic device according to an example embodiment.
Figure 3:
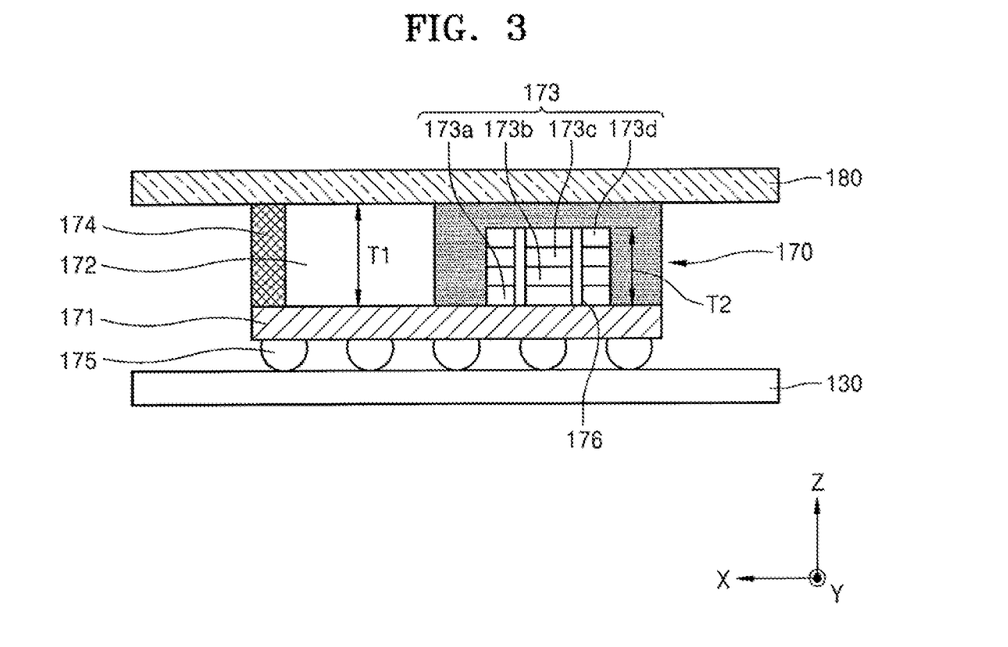
FIG. 3 illustrates a cross-sectional view taken along a line A-A' of FIG. 2.

FIG. 2 is a plan view of the circuit board 130, the semiconductor device package 170, and the heat dissipation structure 180, which are included in an electronic device according to an example embodiment. FIG. 3 is a cross-sectional view taken along a line A-A' of FIG. 2.

Referring to FIGS. 2 and 3, the semiconductor device package 170 mounted on the circuit board 130 may include a package substrate 171, a first semiconductor device 172, a second semiconductor device 173, and a molding 174. The package substrate 171 may be electrically connected to the circuit board 130. The package substrate 171 may be, e.g., a redistribution layer (RDL), a PCB, or an FPCB. Connection members 175 may be used to connect the package substrate 171 to the circuit board 130. The connection members 175 may include an electrically conductive material, such as a metal. For example, the connection members 175 may include solder, one or more of lead (Pb), tin (Sn), silver (Ag), gold (Au), copper (Cu), or aluminum (Al), etc. The connection members 175 may be, e.g., solder bumps, gold (Au) bumps, or copper (Cu) bumps.

The first semiconductor device 172 and the second semiconductor device 173 may be mounted side by side on the package substrate 171. The first semiconductor device 172 and the second semiconductor device 173 may be spaced apart from each other in a lateral direction X parallel to the package substrate 171. Thus, the semiconductor device package 170 may be a side-by-side type.

The second semiconductor device 173 may include a plurality of semiconductor chips, e.g., four semiconductor chips 173a to 173d. The semiconductor chips 173a to 173d may be stacked on the package substrate 171 in a direction Z perpendicular to a major surface of the package substrate 171. Although FIG. 2 illustrates a case in which the second semiconductor device 173 includes four semiconductor chips, the number of semiconductor chips included in the second semiconductor device 173 may be variously changed. In an example embodiment, the semiconductor chips 173a to 173d may be connected to one another through through-silicon vias (TSVs) 176. The TSVs 176 may penetrate each of the semiconductor chips 173a to 173d. The TSVs 176 may include one or more of a metal and a metal nitride. For example, the TSVs 176 may include one or more of titanium (Ti), tantalum (Ta), aluminum (Al), gold (Au), copper (Cu), nickel (Ni), tungsten (W), titanium nitride (TiN), and tantalum nitride (TaN). In another implementation, the semiconductor chips 173a to 173d may be connected to one another by using a wire bonding method.

Each of the first semiconductor device 172 and the second semiconductor device 173 may include, e.g., a memory semiconductor chip or a logic semiconductor chip. For example, the first semiconductor device 172 may include a logic semiconductor chip, and the second semiconductor device 173 may include a memory semiconductor chip. When the second semiconductor device 173 includes the stacked semiconductor chips 173a to 173d, each of the semiconductor chips 173a to 173d may be a memory semiconductor chip or a logic semiconductor chip. For example, the semiconductor chips 173a to 173d may be a memory semiconductor chip. The semiconductor chips 173a to 173d included in the second semiconductor device 173 may be the same type or different types. For example, the lowermost semiconductor chip 173a of the second semiconductor device 173 may be a logic semiconductor chip, while the other semiconductor chips 173b to 173d of the second semiconductor device 173 may be memory semiconductor chips. The logic semiconductor chip may be, e.g., an application processor (AP), a central processing unit (CPU), or a controller. The memory semiconductor chip may be, e.g., dynamic random access memory (DRAM), static RAM (SRAM), phase-change RAM (PRAM), magnetic RAM (MRAM), resistive RAM (RRAM), flash memory, or electrically erasable programmable read-only memory (EEPROM).

In an example embodiment, the amount of heat generated by the first semiconductor device 172 may be greater than the amount of heat generated by the second semiconductor device 173. In general, the amount of heat generated by a logic semiconductor chip may be greater than the amount of heat generated by a memory semiconductor chip. Accordingly, e.g., when the first semiconductor device 172 includes a logic semiconductor chip and the second semiconductor device 173 includes a memory semiconductor chip, the amount of heat generated by the first semiconductor device 172 may be greater than the amount of heat generated by the second semiconductor device 173.

In an example embodiment, the second semiconductor device 173 may have a lower thermal resistance or be more susceptible to heat than the first semiconductor device 172. In general, a memory semiconductor chip may have a lower thermal resistance or may be more susceptible to heat than a logic semiconductor chip. Accordingly, e.g., when the first semiconductor device 172 includes a logic semiconductor chip and the second semiconductor device 173 includes a memory semiconductor chip, the second semiconductor device 173 may have a lower thermal resistance or be more susceptible to heat than the first semiconductor device 172.

In an example embodiment, a thickness T1 of the first semiconductor device 172 in the perpendicular direction Z may be greater than a thickness T2 of the second semiconductor device 173 in the perpendicular direction Z. Thus, a top end of the first semiconductor device 172 may be at a higher level than a top end of the second semiconductor device 173 relative to, e.g., an upper surface of the circuit board 130. When the second semiconductor device 173 includes the stacked semiconductor chips 173a to 173d, the thickness T2 of the second semiconductor device 173 in the perpendicular direction Z may refer to the total thickness of the semiconductor chips 173a to 173d. Thus, the thickness T2 of the second semiconductor device 173 in the perpendicular direction Z may refer to a height from a bottom end of the lowermost semiconductor chip 173a to a top end of the uppermost semiconductor chip 173d in the perpendicular direction Z. The thickness T1 of the first semiconductor device 172 in the perpendicular direction Z may be greater than the thickness T2 of all of the semiconductor chips 173a to 173d in the perpendicular direction Z. Thus, the top end of the first semiconductor device 172 may be at a higher level than a top end of the uppermost semiconductor chip 173d of the second semiconductor device 173. Also, a thickness of each of the semiconductor chips 173a to 173d in the perpendicular direction Z may be less than the thickness T1 of the first semiconductor device 172 in the perpendicular direction Z.

The molding 174 may surround sidewalls of the first semiconductor device 172 and sidewalls of the second semiconductor device 173. The molding 174 may protect the first semiconductor device 172 and the second semiconductor device 173 from chemical and physical environments. The molding 174 may include, e.g., a thermosetting resin, a thermoplastic resin, or an ultraviolet (UV)-curable resin. The molding 174 may include, e.g., an epoxy resin, such as an epoxy mold compound (EMC), or a silicone resin.

The molding 174 may not cover a top surface of the first semiconductor device 172 so as to expose the top surface of the first semiconductor device 172. The exposed top surface of the first semiconductor device 172 may be in contact with the heat dissipation structure 180.

A thermal conductivity of the molding 174 may be lower than a thermal conductivity of the first semiconductor device 172. Thus, when the molding 174 does not cover the top surface of the first semiconductor device 172, heat generated by the first semiconductor device 172 may be transferred to the heat dissipation structure 180 more efficiently than when the molding 174 covers the top surface of the first semiconductor device 172. In addition, when the molding 174 does not cover the top surface of the first semiconductor device 172, a thickness of the semiconductor device package 170 may be reduced.

According to an example embodiment, the molding 174 may cover a top surface of the second semiconductor device 173. Thus, the second semiconductor device 173 and the heat dissipation structure 180 may be spaced apart from each other by the molding 174. The molding 174 having a relatively low thermal conductivity may inhibit heat generated by the first semiconductor device 172 from being transferred to the second semiconductor device 173 through the heat dissipation structure 180 that is in contact with the first semiconductor device 172. As a result, the second semiconductor device 173, which may have a lower thermal resistance or may be more susceptible to heat than the first semiconductor device 172, may be protected from thermal damage, e.g., resulting from heat emitted from the first semiconductor device 172.

The heat dissipation structure 180 may be located on the semiconductor device package 170. The heat dissipation structure 180 may be in contact with the top surface of the first semiconductor device 172. The heat dissipation structure 180 may be not a component of the semiconductor device package 170 but a component of the electronic device 100 (refer to FIG. 1). Thus, the heat dissipation structure 180 may be a set-level heat-radiating component.

The heat dissipation structure 180 may be, e.g., one or more of a heat-dissipation plate, a heat spreader, or a heat-dissipation sheet. The heat dissipation structure 180 may include, e.g., a material having a high thermal conductivity, such as copper (Cu), nickel (Ni), silver (Ag), gold (Au), or aluminum (Al). In an example embodiment, the heat dissipation structure 180 may include a composite material including a thermal conductive filler and a polymer. The thermal conductive filler may include one or more of a metal filler, a ceramic filler, or a carbon filler. The metal filler may include, e.g., one or more of copper (Cu), nickel (Ni), silver (Ag), gold (Au), or aluminum (Al). The ceramic filler may include, e.g., one or more of aluminum nitride (AlN), alumina ($Al_2O_3$), boron nitride (BN), beryllium oxide (BeO), or silicon carbide (SiC). The carbon filler may include, e.g., one or more of graphite, carbon nanotubes (CNTs), carbon fibers, or graphene.

Although FIG. 2 illustrates a case in which the heat dissipation structure 180 has a square shape, a shape of the heat dissipation structure 180 may be variously changed considering the heat-radiating performance and the arrangement of surrounding components. In an example embodiment, a maximum length L2 of the heat dissipation structure 180 in a direction Y parallel to the circuit board 130 may be greater than a maximum length L1 of the semiconductor device package 170 in the direction Y. In an example embodiment, a planar area of the heat dissipation structure 180 may be greater than a planar area of the semiconductor device package 170. When the heat dissipation structure 180 includes a plurality of components, a length or planar area of the heat dissipation structure 180 may refer to a length or planar area of the overall appearance formed by all components that constitute the heat dissipation structure 180 and are thermally coupled to one another. When the heat dissipation structure 180 has a greater length than the semiconductor device package 170 in a direction or has a greater planar area than the semiconductor device package 170, heat generated by the semiconductor device package 170 may be efficiently dissipated.

According to an example embodiment, the heat dissipation structure 180 is not included in the semiconductor device package 170. Thus, a thickness of the semiconductor device package 170 may be reduced, and accordingly, a thickness of the electronic device 100 (refer to FIG. 1) may also be reduced. The set-level heat dissipation structure 180 may be in direct contact with the semiconductor device package 170. Thus, heat generated by the semiconductor device package 170 may be efficiently dissipated.

The semiconductor device package 170 according to an example embodiment may be a side-by-side type in which the first semiconductor device 172 and the second semiconductor device 173 are spaced apart from each other in the lateral direction X. Thus, heat generated by the first semiconductor device 172 and the second semiconductor device 173 may be transferred more efficiently to the outside of the semiconductor device package 170 as compared with, e.g., a Package-on-Package (PoP) type in which the first semiconductor device 172 and the second semiconductor device 173 are stacked in the perpendicular direction Z. According to the present example embodiment, the first semiconductor device 172, which generates a relatively great amount of heat compared to the second semiconductor device 173, is in contact with the heat dissipation structure 180. Thus, the heat generated by the first semiconductor device 172 may be efficiently transferred to the heat dissipation structure 180.

Figure 4:
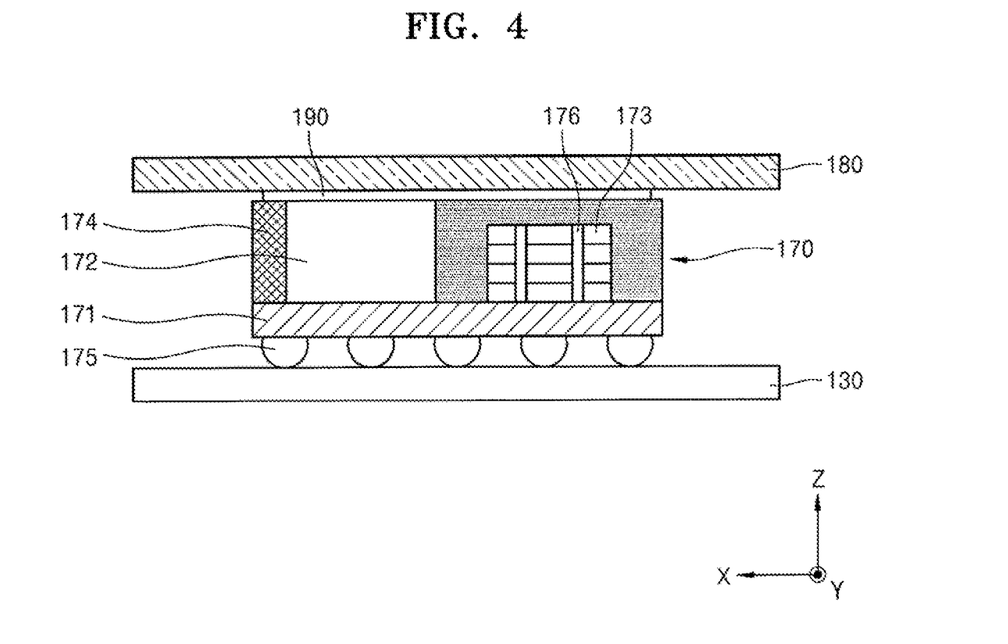
FIG. 4 illustrates a cross-sectional view of a circuit board, a semiconductor device package, and a heat dissipation structure, which are included in an electronic device according to an example embodiment.

FIG. 4 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIG. 3 will be described.

Referring to FIG. 4, in addition to the components of the electronic device shown in FIG. 3, the electronic device according to the present example embodiment may further include a thermal interface material (TIM) layer 190 located on the semiconductor device package 170. The TIM layer 190 may be between the semiconductor device package 170 and the heat dissipation structure 180 and in contact with the semiconductor device package 170 and the heat dissipation structure 180. In an example embodiment, as shown in FIG. 4, the TIM layer 190 may extend over a portion of the molding 174 which is located on the second semiconductor device 173. In another implementation, the TIM layer 190 may not extend over the portion of the molding 174 which is located on the second semiconductor device 173. For example, an air gap may be formed between the portion of the molding 174 that is located on the second semiconductor device 173 and the heat dissipation structure 180.

The TIM layer 190 may reinforce thermal coupling between two components, which are in contact with the TIM layer 190, and facilitate the transfer of heat between the two components. Accordingly, the TIM layer 190 may reinforce thermal coupling between the semiconductor device package 170 and the heat dissipation structure 180. For example, a top surface of a first semiconductor device 172 may be in contact with the TIM layer 190, and the TIM layer 190 may be in contact with the heat dissipation structure 180 so that heat generated by the first semiconductor device 172 may be efficiently transferred to the heat dissipation structure 180.

The TIM layer 190 may include, e.g., one or more of thermal grease, a thermally conductive reactive compound, a thermally conductive elastomer, or a thermally conductive adhesive tape.

Figure 5:
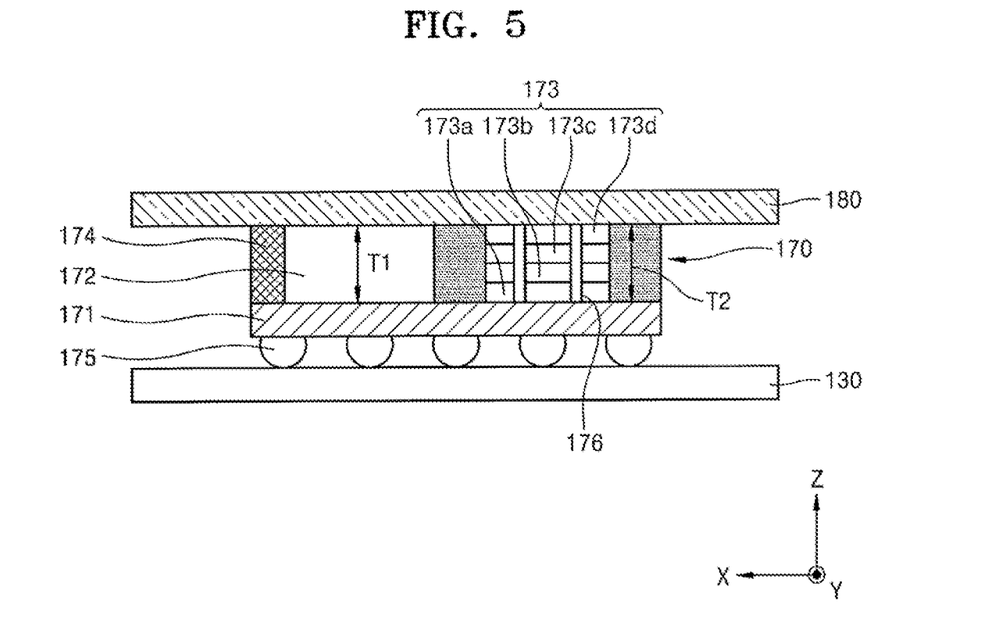
FIG. 5 illustrates a cross-sectional view of a circuit board, a semiconductor device package, and a heat dissipation structure, which are included in an electronic device according to an example embodiment.

FIG. 5 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIG. 3 will be described.

Referring to FIG. 5, a thickness T1 of a first semiconductor device 172 in a perpendicular direction Z may be substantially equal to a thickness T2 of a second semiconductor device 173 in a perpendicular direction Z. Thus, a top end of the first semiconductor device 172 may be at substantially the same level as a top end of the second semiconductor device 173. When the second semiconductor device 173 includes a plurality of stacked semiconductor chips, e.g., stacked semiconductor chips 173a to 173d, the top end of the first semiconductor device 172 may be at substantially the same level as a top end of the uppermost semiconductor chip 173d of the second semiconductor device 173.

A molding 174 may not cover but expose a top surface of the second semiconductor device 173. The second semiconductor device 173 may be in contact with a heat dissipation structure 180. Thus, heat generated by the second semiconductor device 173 may be efficiently transferred to the heat dissipation structure 180. When the second semiconductor device 173 includes a plurality of stacked semiconductor chips, e.g., stacked semiconductor chips 173a to 173d, a top surface of the uppermost semiconductor chip 173d of the second semiconductor device 173 may not be covered with the molding 174 but may be in contact with the heat dissipation structure 180.

Figure 6:
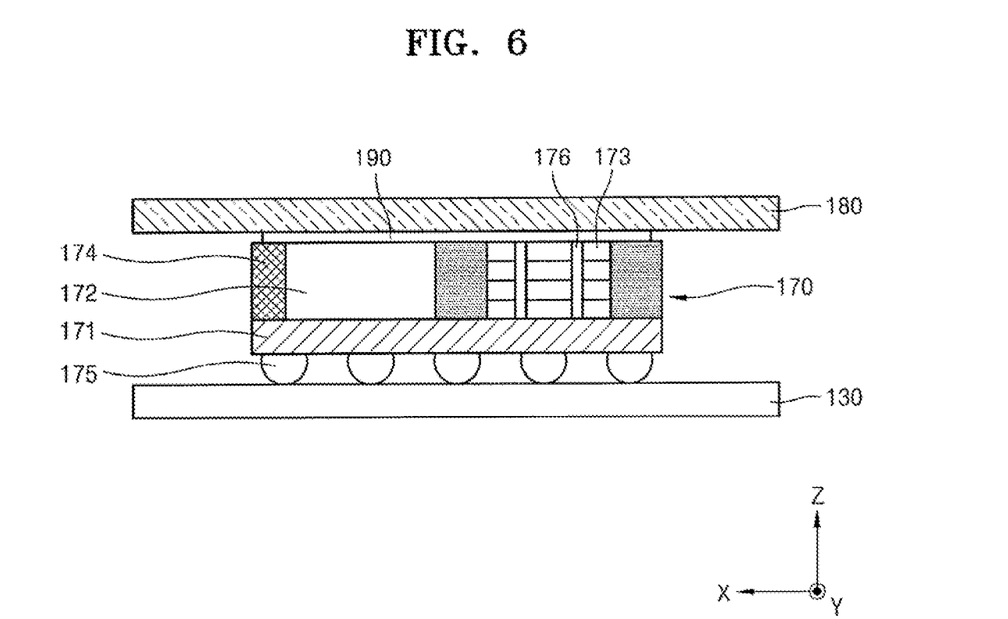
FIG. 6 illustrates a cross-sectional view of a circuit board, a semiconductor device package, and a heat dissipation structure, which are included in an electronic device according to an example embodiment.

FIG. 6 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIG. 5 will be described.

Referring to FIG. 6, in addition to the components of the electronic device shown in FIG. 5, the electronic device according to the present example embodiment may further include the TIM layer 190. The TIM layer 190 may be in contact with an upper portion of the semiconductor device package 170. The TIM layer 190 may be in contact with a first semiconductor device 172 and a second semiconductor device 173 of the semiconductor device package 170. Accordingly, not only heat generated by the first semiconductor device 172 but also heat generated by the second semiconductor device 173 may be efficiently transferred to the heat dissipation structure 180 through the TIM layer 190.

Figure 7:
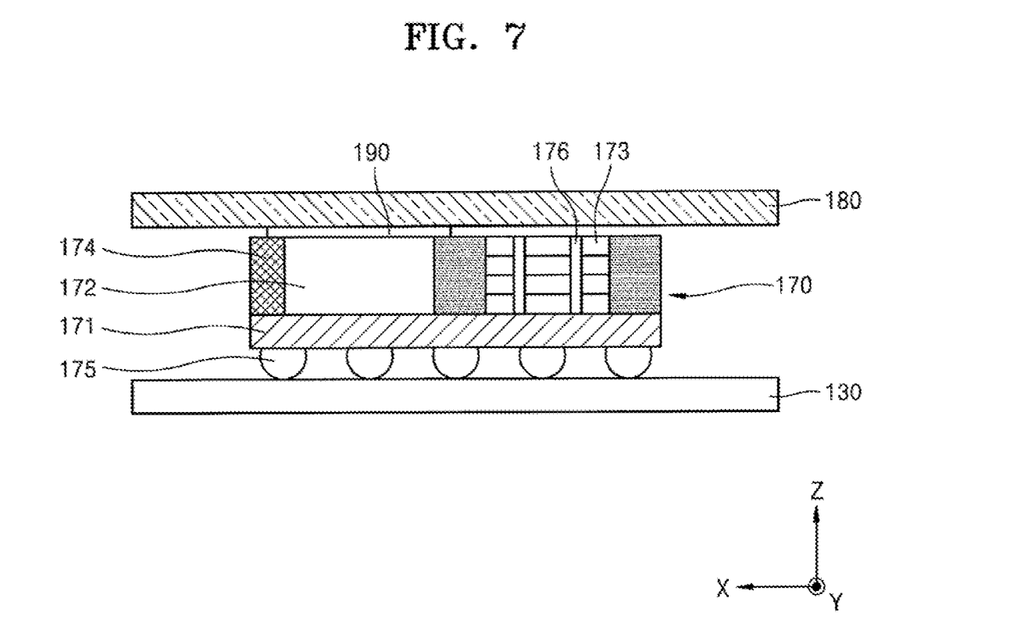
FIG. 7 illustrates a cross-sectional view of a circuit board, a semiconductor device package, and a heat dissipation structure, which are included in an electronic device according to an example embodiment.

FIG. 7 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIG. 6 will be described.

Referring to FIG. 7, a top surface of a first semiconductor device 172 may be covered with the TIM layer 190, while a top surface of a second semiconductor device 173 may not be covered with the TIM layer 190. Thus, the TIM layer 190 may be in contact with the heat dissipation structure 180 and the first semiconductor device 172 but may not be in contact with the second semiconductor device 173. When the TIM layer 190 is between the first semiconductor device 172 and the heat dissipation structure 180, heat generated by the first semiconductor device 172 may be efficiently transferred to the heat dissipation structure 180. In contrast, the second semiconductor device 173 and the heat dissipation structure 180 may be spaced apart from each other, and there may be an air gap between the second semiconductor device 173 and the heat dissipation structure 180. In another implementation, a heat insulating material may be between the second semiconductor device 173 and the heat dissipation structure 180. Due to the presence of the air gap or the heat insulating material, heat transfer may be inhibited between the second semiconductor device 173 and the heat dissipation structure 180. Accordingly, a heat emitted by the first semiconductor device 172 may be prevented from being transferred through the heat dissipation structure 180 to the second semiconductor device 173, which may be susceptible to heat. As a result, the second semiconductor device 173 may be protected.

Figure 8:
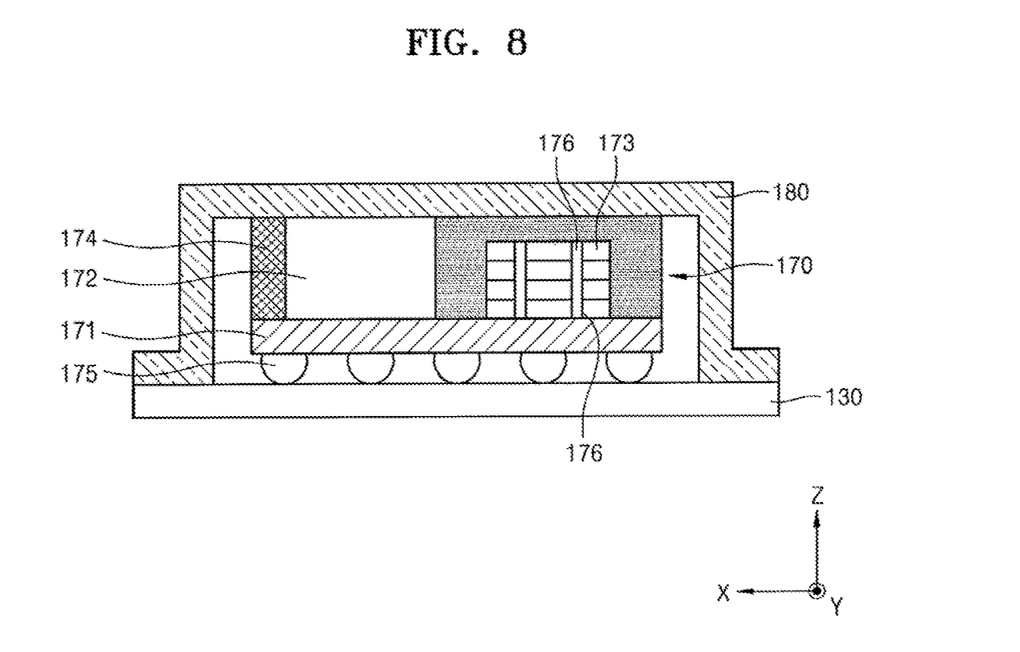
FIG. 8 illustrates a cross-sectional view of a circuit board, a semiconductor device package, and a heat dissipation structure, which are included in an electronic device according to an example embodiment.

FIG. 8 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIG. 3 will be described.

Referring to FIG. 8, the heat dissipation structure 180 may be, e.g., a shield can. The heat dissipation structure 180 may not only cover a top surface of the semiconductor device package 170 but also surround a sidewall of the semiconductor device package 170. The heat dissipation structure 180 may perform not only a heat dissipation function but also, e.g., an electromagnetic interference (EMI) shielding function. The heat dissipation structure 180 may include, e.g., a metal (e.g., copper (Cu), nickel (Ni), or aluminum (Al)) having excellent thermal conductivity and electrical conductivity.

FIG. 8 illustrates a case in which a top surface of a second semiconductor device 173 is covered with the molding 174. In another implementation, the top surface of the second semiconductor device 173 may not be covered with the molding 174 like a top surface of a first semiconductor device 172. In an implementation, the top surface of the second semiconductor device 173 may be in contact with the heat dissipation structure 180. In other implementations, to reinforce thermal coupling between the semiconductor device package 170 and the heat dissipation structure 180, the TIM layer 190 (refer to FIGS. 4, 6, and 7) may be between the semiconductor device package 170 and the heat dissipation structure 180.

Figure 9:
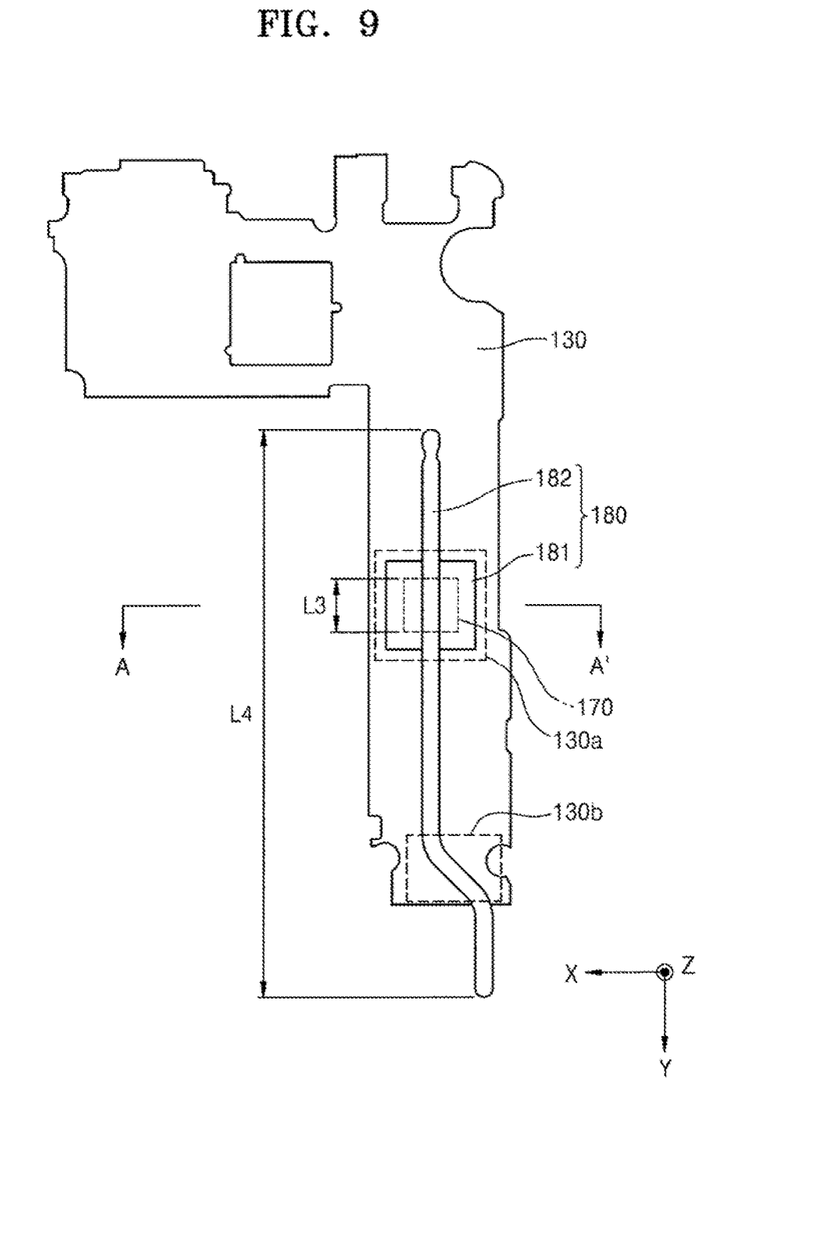
FIG. 9 illustrates a plan view of a circuit board, a semiconductor device package, and a heat dissipation structure, which are included in an electronic device according to an example embodiment.
Figure 10:
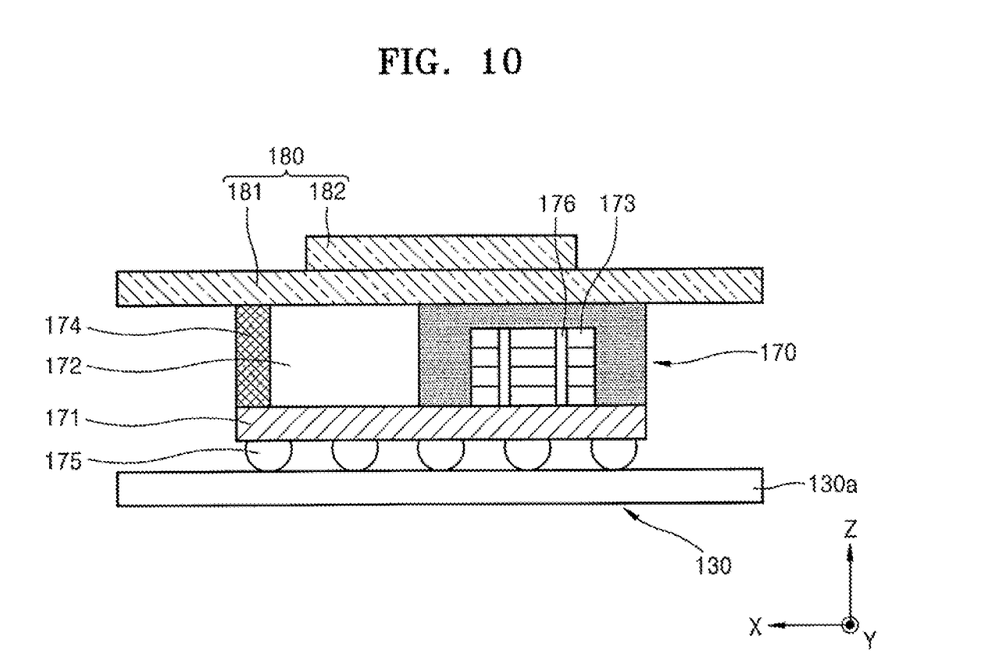
FIG. 10 illustrates a cross-sectional view taken along a line A-A' of FIG. 9.

FIG. 9 is a plan view of the circuit board 130, the semiconductor device package 170, and the heat dissipation structure 180, which are included in an electronic device according to an example embodiment. FIG. 10 is a cross-sectional view taken along a line A-A' of FIG. 9. Hereinafter, differences between the present example embodiment and the embodiment illustrated in FIGS. 2 and 3 will be described.

Referring to FIGS. 9 and 10, the circuit board 130 may have a first region 130*a* and a second region 130*b*, which may be apart from each other. Electronic component(s) configured to generate a relatively great amount of heat may be mounted on the first region 130*a* of the circuit board 130. For example, the semiconductor device package 170 may be mounted on the first region 130*a*. In contrast, electronic components configured to generate a relatively small amount of heat may be mounted on the second region 130*b* of the circuit board 130 or any electronic component may not be mounted thereon. Accordingly, during operations of the electronic device, a temperature of the first region 130*a* may be higher than a temperature of the second region 130*b*. The heat dissipation structure 180 located on the semiconductor device package 170 may extend across the first region 130*a*, which is a relatively high-temperature region, to the second region 130*b*, which is a relatively low-temperature region.

The heat dissipation structure 180 may include, e.g., a heat absorber 181 and a heat transferer 182. As shown in FIG. 10, the heat absorber 181 and the heat transferer 182 may be two independent objects. In another implementation, the heat absorber 181 and the heat transferer 182 may be formed as one integrated body.

The heat absorber 181 may have a structure or shape configured to absorb heat generated by the semiconductor device package 170 and transfer the heat to the heat transferer 182. The heat absorber 181 may be in contact with a top surface of the semiconductor device package 170. The heat absorber 181 may be in contact with a top surface of the first semiconductor device 172. Although FIGS. 9 and 10 illustrate a case in which a planar area of the heat absorber 181 is greater than a planar area of the semiconductor device package 170, in some cases, the planar area of the heat absorber 181 may be equal to or less than the planar area of the semiconductor device package 170. The heat absorber 181 may include, e.g., a metal (e.g., one or more of copper (Cu) or aluminum (Al)) having a good thermal conductivity.

The heat transferer 182 may be in contact with the heat absorber 181 and receive heat from the heat absorber 181. For example, the heat transferer 182 may be located on the heat absorber 181. The heat transferer 182 may transmit heat generated by the first region 130*a* to the second region 130*b*, which is the relatively low-temperature region. The heat transferer 182 may be, e.g., a heat pipe. A fluid may be included in the heat pipe so that heat may be transferred, e.g., by using a phase-change energy of the fluid. A maximum length L4 of the heat dissipation structure 180 in a direction Y parallel to the circuit board 130 (i.e., a maximum length of the heat transferer 182 in the direction Y) may be greater than a maximum length L3 of the semiconductor device package 170 in the direction Y. Accordingly, heat generated by the semiconductor device package 170 may be transferred to a region (e.g., the second region 130*b*) far from the semiconductor device package 170 so that heat may be efficiently dissipated.

Although FIG. 10 illustrates a case in which a top surface of a second semiconductor device 173 is covered with a molding 174, in some embodiments, the top surface of the second semiconductor device 173 may not be covered with the molding 174 like the top surface of the first semiconductor device 172. In another implementation, the top surface of the second semiconductor device 173 may be in contact with the heat absorber 181.

Figure 11:
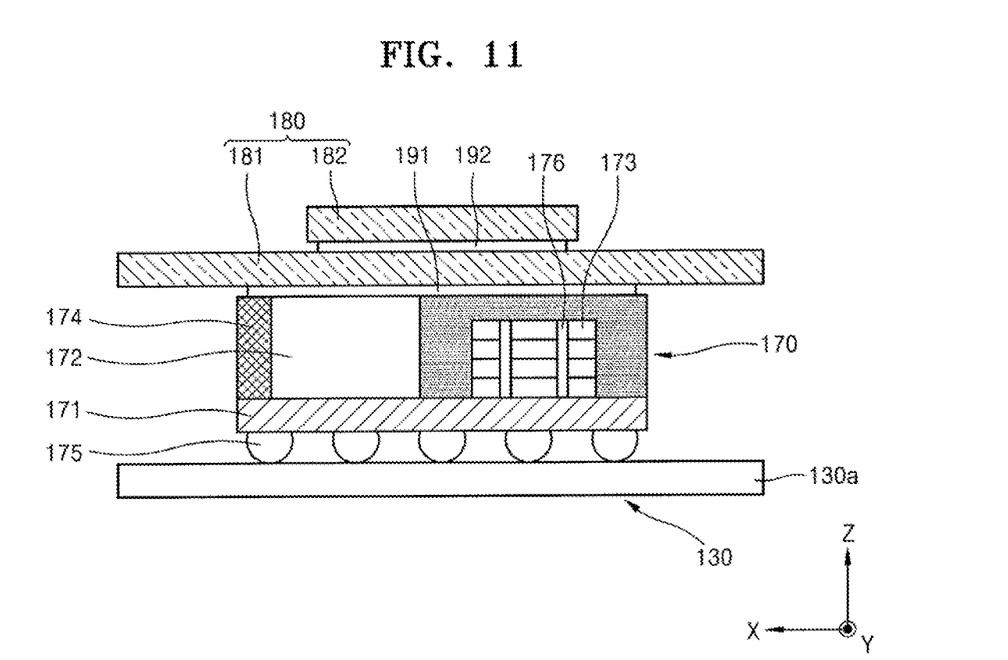
FIG. 11 illustrates a cross-sectional view of a circuit board, a semiconductor device package, and a heat dissipation structure, which are included in an electronic device according to an example embodiment.

FIG. 11 is a cross-sectional view of the circuit board 130, the semiconductor device package 170, and the heat dissipation structure 180, which are included in an electronic device according to an example embodiment. Hereinafter, differences between the present example embodiment and the embodiment illustrated in FIGS. 9 and 10 will be described.

Referring to FIG. 11, in addition to the components of the electronic device shown in FIG. 9, the electronic device according to the present example embodiment may further include one or more of a first TIM layer 191 and a second TIM layer 192.

The first TIM layer 191 may be between the semiconductor device package 170 and an heat absorber 181 to reinforce thermal coupling between the semiconductor device package 170 and the heat absorber 181. The second TIM layer 192 may be between the heat absorber 181 and a heat transferer 182 to reinforce thermal coupling between the heat absorber 181 and the heat transferer 182.

Although FIG. 11 illustrates a case in which a top surface of a second semiconductor device 173 is covered with a molding 174, in some embodiments, the top surface of the second semiconductor device 173 may not be covered with the molding 174 like a top surface of a first semiconductor device 172. In some cases, the top surface of the second semiconductor device 173 may or may not be in contact with the first TIM layer 191.

The electronic device according to the present example embodiment may further include one or more of the first TIM layer 191 and the second TIM layer 192 so that heat generated by the semiconductor device package 170 may be efficiently transferred to the heat transferer 182.

Figure 12:
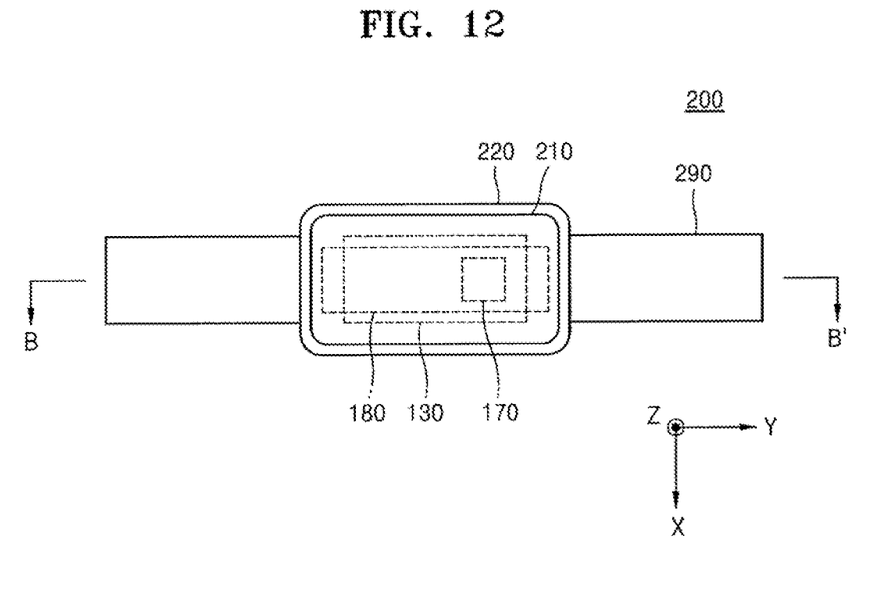
FIG. 12 illustrates a plan view of an electronic device including a semiconductor device package according to an example embodiment.
Figure 13:
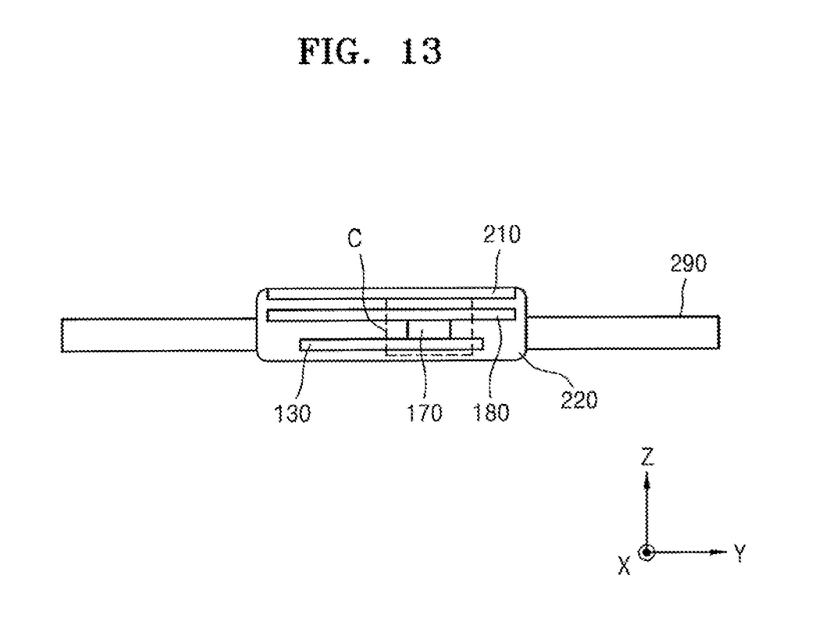
FIG. 13 illustrates a cross-sectional view taken along a line B-B' of FIG. 12.

FIG. 12 is a plan view of an electronic device 200 including a semiconductor device package according to an example embodiment. FIG. 13 is a cross-sectional view taken along a line B-B' of FIG. 12.

Referring to FIGS. 12 and 13, the electronic device 200 may be, e.g., a wearable device, such as a smart watch. The electronic device 200 may include a housing 220, a display 210, wear portions 290, the circuit board 130 on which the semiconductor device package 170 is mounted, and the heat dissipation structure 180.

The housing 220 may include various electronic components including the circuit board 130 and the semiconductor device package 170 mounted on the circuit board 130. The wear portions 290 may be connected to both sides of the housing 220. The wear portions 290 may fix the electronic device 200 to a part (e.g., a wrist) of a person's body. The display 210 may be mounted in an upper portion of the housing 220. A screen may output information by using the display 210, and information or commands may be input by using a touch screen. The display 210, the housing 220, and the wear portions 290 may form an appearance of the electronic device 200.

The circuit board 130 may be located in the housing 220, and at least one semiconductor device package 170 may be mounted on the circuit board 130. The heat dissipation structure 180 configured to dissipate heat generated by the semiconductor device package 170 may be located on the semiconductor device package 170.

Detailed descriptions of the circuit board 130, the semiconductor device package 170, and the heat dissipation structure 180 may be the same as the descriptions provided with reference to FIGS. 3 to 8, 10, and 11. Thus, an enlarged view of region C of FIG. 13 may be the same as in FIG. 3 to 8, 10, or 11.

In an implementation, the heat dissipation structure 180 may extend beyond the housing 220 and/or into the wear portions 290. In this case, the heat dissipation performance of the heat dissipation structure 180 may be improved due to a long length of the heat dissipation structure 180. According to an example embodiment, the wear portions 290 may be included in a portion of the heat dissipation structure 180. For example, fluid may be included in the wear portions 290. The wear portions 290 may function as a portion of the heat dissipation structure 180 by using the phase change of the fluid. For example, a portion of the heat dissipation structure 180 may be located in the housing 220 and in contact with the semiconductor device package 170 and another portion of the heat dissipation structure 180 may be in contact with or inserted in one end of the wear portion 290.

According to an example embodiment, the electronic device 200 may prevent a wearer's body from being damaged by heat generated during operation of the electronic device 200 and may have a small thickness.

By way of summation and review, heat generated by a semiconductor device package may be increased with a reduction in size, an increase in functionality, etc. When the generated heat is not efficiently dissipated, the semiconductor device package and surrounding electronic components thereof may be damaged. Accordingly, it is desired that an electronic device including a semiconductor device package efficiently dissipate heat generated by the semiconductor device package and have a small thickness.

As described above, embodiments may provide an electronic device including a semiconductor device package, which may efficiently dissipate heat generated by the semiconductor device package and have a small thickness.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device package, comprising:
   a redistribution layer;
   a logic chip on the redistribution layer;
   a stack of memory chips next to the logic chip on the redistribution layer, the memory chips are stacked in a vertical direction and connected to one another through through-silicon vias (TSVs); and
   a molding surrounding a sidewall of the logic chip and a sidewall of the stack of memory chips, wherein:
   a thickness of the logic chip in the vertical direction is greater than a thickness of the stack of memory chips in the vertical direction,
   the molding does not cover a top surface of the logic chip,
   the molding covers a top surface of an uppermost memory chip of the stack of memory chips, and
   no semiconductor chip is located on the top surface of the uppermost memory chip.

2. The semiconductor device package as claimed in claim 1, wherein the logic chip comprises an application processor chip.

3. The semiconductor device package as claimed in claim 1, wherein each of the memory chips comprises a DRAM chip.

4. The semiconductor device package as claimed in claim 1, wherein no semiconductor chip is located on the top surface of the logic chip.

5. The semiconductor device package as claimed in claim 1, wherein the molding directly contacts with the logic chip.

6. The semiconductor device package as claimed in claim 1, wherein a thermal conductivity of the molding is lower than a thermal conductivity of the logic chip.

7. The semiconductor device package as claimed in claim 1, wherein an amount of heat generated by the logic chip is greater than an amount of heat generated by the stack of memory chips.

8. An electronic device, comprising:
   a redistribution layer;
   a logic chip on the redistribution layer;
   a stack of memory chips next to the logic chip on the redistribution layer, the memory chips are stacked in a vertical direction and connected to one another through through-silicon vias (TSVs); and
   a molding surrounding a sidewall of the logic chip and a sidewall of the stack of memory chips;
   a heat dissipation structure on a top surface of the logic chip; and a thermal interface material (TIM) layer between the top surface of the logic chip and the heat dissipation structure, wherein:

the molding does not cover the top surface of the logic chip, and the TIM layer covers the top surface of the logic chip, the molding does not cover a top surface of an uppermost memory chip of the stack of memory chips, and the TIM layer does not extend over the top surface of the uppermost memory chip, no semiconductor chip is located on the top surface of the uppermost memory chip, no semiconductor chip is located on the top surface of the logic chip, and no semiconductor chip is located between the logic chip and the redistribution layer.

9. The electronic device as claimed in claim 8, wherein a thickness of the logic chip in the vertical direction is the same as a thickness of the stack of memory chips in the vertical direction.

10. The electronic device as claimed in claim 8, wherein the top surface of the uppermost memory chip, the top surface of the logic chip, and a top surface of the molding are coplanar.

11. The electronic device as claimed in claim 8, wherein the TIM layer does not contact with the top surface of the uppermost memory chip.

12. The electronic device as claimed in claim 11, wherein the top surface of the uppermost memory chip is spaced apart from the heat dissipation structure.

13. The electronic device as claimed in claim 8, wherein a maximum length of the heat dissipation structure in a horizontal direction perpendicular to the vertical direction is greater than a maximum length of the redistribution layer in the horizontal direction.

14. The electronic device as claimed in claim 8, wherein a maximum length of the heat dissipation structure in a horizontal direction perpendicular to the vertical direction is greater than a maximum length of the molding in the horizontal direction, and the heat dissipation structure extends in the horizontal direction beyond outermost sidewalls of the molding so that the outermost sidewalls of the molding do not contact the heat dissipation structure in the horizontal direction.

15. An electronic device, comprising:

a redistribution layer;

an application processor chip on the redistribution layer;

a stack of DRAM chips next to the application processor chip on the redistribution layer, the DRAM chips are connected to one another through through-silicon vias (TSVs);

a molding extending in a vertical direction along a sidewall of the application processor chip and along a sidewall of the stack of DRAM chips; and a heat dissipation structure on a top surface of the application processor chip, wherein:

a top surface of the molding, the top surface of the application processor chip, and a top surface of an uppermost DRAM chip of the stack of DRAM chips are coplanar, no semiconductor chip is located on the top surface of the uppermost DRAM chip, and the heat dissipation structure extends, in a horizontal direction perpendicular to the vertical direction, beyond outermost sidewalls of the molding so that the outermost sidewalls of the molding do not contact the heat dissipation structure in the horizontal direction.

* * * * *